Figures 1, 2:
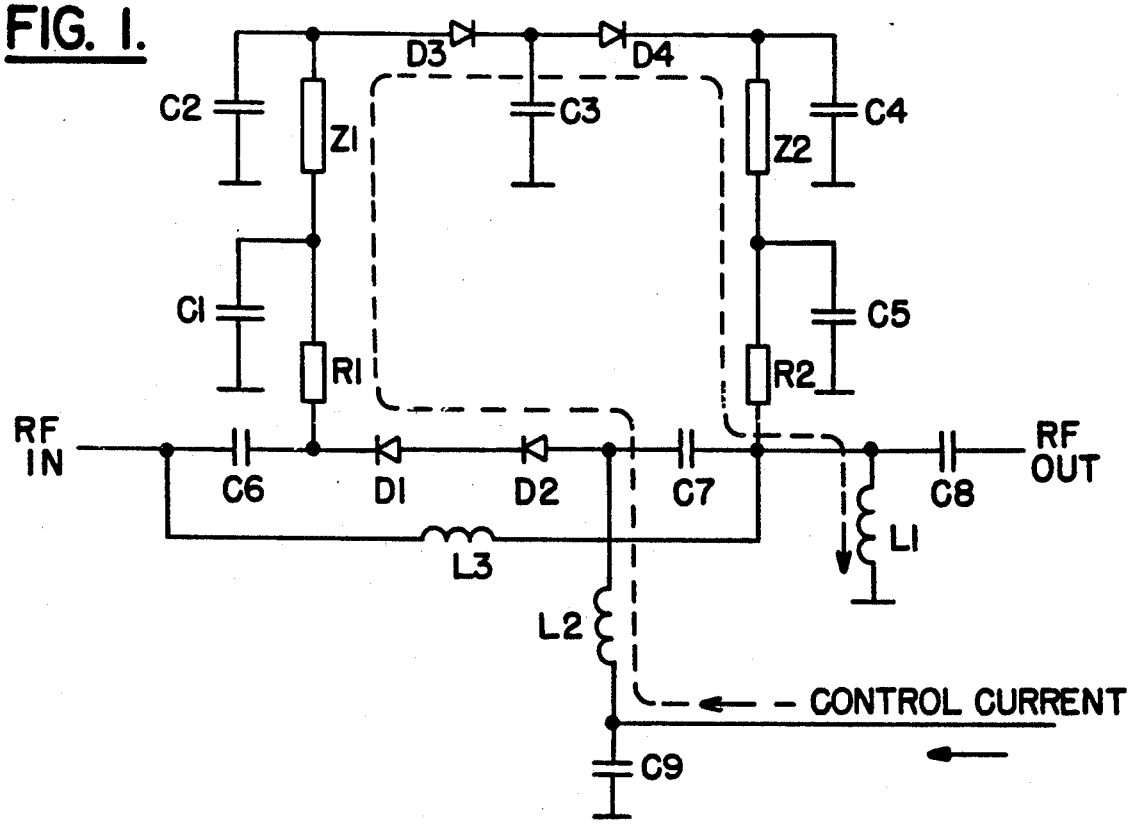

United States Patent [19]

Verronen

[11] Patent Number: 5,204,643

[45] Date of Patent: Apr. 20, 1993

[54] CONTROLLABLE HIGH-FREQUENCY ATTENUATOR

[75] Inventor: Jouni I. Verronen, Kannokkotie, Finland

[73] Assignee: Nokia Mobile Phones Ltd., Salo, Finland

[21] Appl. No.: 817,777

[22] Filed: Jan. 8, 1992

[30] Foreign Application Priority Data

Jan. 14, 1991 [FI] Finland .................................. 910188

[51] Int. Cl.$^5$ .............................................. H01P 1/22
[52] U.S. Cl. .................................. 333/81 R; 333/81 A
[58] Field of Search ............................. 333/81 R, 81 A

[56] References Cited

U.S. PATENT DOCUMENTS

| | | | |
|---|---|---|---|
| 4,019,160 | 4/1977 | Kam | 333/81 R |
| 4,097,827 | 6/1978 | Williams | 333/81 R |
| 4,668,882 | 5/1987 | Matsuura | 333/81 R X |

FOREIGN PATENT DOCUMENTS

| | | | |
|---|---|---|---|
| 88911 | 5/1983 | Japan | 333/81 R |
| 117408 | 5/1989 | Japan | 333/81 R |

*Primary Examiner*—Paul Gensler
*Attorney, Agent, or Firm*—Perman & Green

[57] ABSTRACT

The present invention decribes a high-frequency attenuator using PIN diodes, which is especially intended as power control means in a radio-telephone transmitter, and in which the input and output impedances remain constant as the attenuation is varied. The attenuator comprises a longitudinal branch between the input and the output port, having PIN diodes (D1, D2) attenuating the RF signal, transverse branches connected with the input and the output port, each comprising a quarter-wavelength transformer (C1, Z1, C2; C4, Z2, C5) viewed from the signal path and a PIN diode (D3, D4). The same control direct current passes via all the diodes. In spite of the variations of the resistance of the PIN diodes, the input and output impedances of the attenuator do not change owing to the quarter-wavelength transformer.

8 Claims, 1 Drawing Sheet

| GIVEN VALUES | | | CALCULATED VALUES | |
|---|---|---|---|---|
| $Z_0 2$ /ohm | $R_1 = R_2$ /ohm | L/dB | R/ohm | Ri' |
| 45 | 47 | 1 | 749.01 | 49.18 |
| 45 | 47 | 2 | 395.69 | 49.06 |
| 45 | 47 | 3 | 276.92 | 49.29 |
| 45 | 47 | 4 | 216.82 | 49.70 |
| 45 | 47 | 5 | 180.23 | 50.18 |
| 45 | 47 | 6 | 155.43 | 50.67 |
| 45 | 47 | 7 | 137.40 | 51.14 |
| 45 | 47 | 8 | 123.64 | 51.56 |
| 45 | 47 | 9 | 112.76 | 51.92 |
| 45 | 47 | 10 | 103.92 | 52.21 |
| 45 | 47 | 15 | 76.75 | 52.52 |
| 45 | 47 | 20 | 63.36 | 51.51 |
| 45 | 47 | 25 | 56.14 | 50.14 |
| 45 | 47 | 30 | 52.13 | 49.00 |
| 45 | 47 | 35 | 49.88 | 48.20 |
| 45 | 47 | 40 | 48.62 | 47.70 |
| 45 | 47 | 45 | 47.91 | 47.40 |
| 45 | 47 | 50 | 47.51 | 47.23 |

CONTROLLABLE HIGH-FREQUENCY ATTENUATOR

The present invention relates to an attenuator usable as an power control means in a radio-telephone transmitter.

In transmitters using new modulating techniques of QAM type, conventional power control couplings are not adequate, because no significant intermodulation products should be generated in the amplifier stages of the transmitter and since the requirements on phase response repetition and rise times are severe. In such radio-technical implementations, the output power of the transmitter is not controlled by controlling the amplifier chain, but an power control means is required, which is easy to control, is linear in the power control range and causes minimal distortion in the attenuated signal. Such an appropriate means is a PIN diode, the use of which is known per se in prior art in amplifiers intended for radio frequency. The major property of a PIN diode is its internal capacity of acting as a current controlled resistor at radio frequency. Most diodes have this property to some exent, however, the PIN diode is specially designed to have a large resistance range and a low distortion. In typical implementations, the control current varying from one microampere to one hundred milliamperes, the resistance of the PIN diode changes from over ten kilo-Ohm to approximately one Ohm. This resistance that varies according to the current enables the use of a diode in the attenuation of a radio frequency signal.

There are several implementations of attenuation circuits. An example of these is a modulator, in which the input RF signal is attenuated as a function of the control or modulating direct current in order to generate an amplitude modulation. Another example is for instance the amplifier used in the transmitter of a radio-telephone described in the U.S. Pat. No. 4,392,245, by means of which a radio frequency signal can be attenuated before the power amplifier. The amplifier is controlled by a control circuit, in which PIN diodes have been used to enlarge the output power range of the transmitter. In all attenuator constructions for high frequency, an appropriate matching of the attenuator ports to the rest of the circuitry is essential, since poor matching causes the impedances viewed by the active components to differ from the impedances required by optimal operation, causing a lower peformance, such as a deterioration of the amplification, the maximal output power, the power transfer ratio or the intermodulation properties. It is difficult to retain a maximal constancy of the input and output impedances of the amplifier by means of attenuators performed with PIN diodes, the resistances of the diodes varying under the effect of the control current. In known couplings, the constancy of the impedances has been aimed at by using complicated diode controls, carried out for instance with individual control currents.

The present invention describes an attenuator using PIN diodes, which is especially intended as a power control element in the transmitter of a radio-telephone and by means of which the constancy of the input and output impedances is well retained as the attenuation is modified. When an appropriate control circuit (not represented) forming the control current is used, the RF voltage supplied by the attenuator follows the control current linearly. In this case, the gain of the amplifier of the transmitter is not dependent on the signal level. This linearity is measured by intermodulation measurements, i.e. the lower the intermodulation, the better the linearity in the entire control range.

The attenuator according to the invention is characterized by the features described in claim 1.

Thus, the attenuator according to the invention is a high frequency attenuator controlled with direct current, in which the PIN diodes are serial in view of the control current, but in view of the RF signal, the attenuator forms a ladder network. The impedances seen in the input and output ports of the attenuator remain sufficiently constant as the attenuation is being regulated. This has been achieved according to the invention by realizing each transverse branch with a network, which has been dimensioned so that the impedance appearing at the upper end of the transverse branch varies under control along with the different attenuation values, equalling the required transverse resistance value in a resistive pi ($\pi$) attenuator with a constant impedance. The attenuator operation is to a major part based on the use of a quarter-wavelength transformer made of a transmission line or an equivalent reactive network, which transforms the impedance represented by the PIN diode forming the lower end of the branch.

The attenuator according to the invention is described in further detail with reference to the enclosed figures, of which FIG. 1 shows a possible connection of the attenuator and FIG. 2 shows a number of electric values calculated for this attenuator.

PIN diodes D1 and D2, behaving as DC controlled resistors, act as the virtual attenuating means of a radio frequency signal in the longitudinal branch between the input and output ports. The internal capacitance of the diodes D1 and D2 forms a parallel capacitance of a specific value, which would reduce the attenuation to be achieved. For this reason, an inductive means L3, serving to compensate the parallel capacitance, has been connected parallel to these diodes. The control direct current of the attenuator is supplied for instance by a suitable circuit connection (not represented) generating the control current. This control direct current is taken via the inductive means L2 to the anode of PIN diode D2. The means L2 prevents the access of the RF signal to the control circuit. Capacitors C6 and C7 act as separating capacitors for the control direct current and do not affect the RF signal to be attenuated. The transverse branch on the side of the input port of the attenuator is formed by the resistance R1, supplying the constant portion of the branch impedance, a quarter-wavelength transformer realized with the help of a microstrip Z1 and a capacitor C1 and C2 connected between its both ends and the ground and PIN diode D3. The quarter-wavelength transformer can of course be carried out simply by a transmission line with the length of a quarter-wavelength. In this case, the length of the microstrip would be longer than in the connection presented here, in which the length has been considerably reduced by connecting the capacitive means C1 and C2 to each end of the strip. The transverse branch on the side of the output port of the attenuator is formed respectively by the resistance R2 supplying the constant portion of the branch impedance, a quarter-wavelength transformer realized with the aid of the microstrip Z2 and a capacitor C4 and C5 connected between its both ends and the ground, and PIN diode D4. PIN diodes D3 and D4 at the end of the branches are connected with each other and grounded to the circuit via a common capacitor C3. The inductance L1, which represents a high impedance to the RF frequency, but a very low impedance to the control direct current, is connected between the capacitor C7 and the output port of the attenuating circuit, between the longitudinal branch and the circuit ground.

With regard to the control direct current, the circuit operation is the following;

the input control direct current advances along the path indicated with a dotted line via PIN diodes D1 and D2 of the longitudinal branch to the transverse branch on the side of the input port and further via its PIN diode D3 to PIN diode D4 of the transvese branch on the side of the output port. After the diode the control direct current advances via microstrip Z2, resistor R2 and coil L1 to the circuit ground. Thus, PIN diodes D1-D4 are serial from the point of view of the control current and the control current sets a specific resistance value for each PIN diode D1-D4.

From the view of a radio frequency signal, the attenuator is a ladder network, the longitudinal branch of which is formed by PIN diodes D1 and D2 and in which the transverse branches on the side of the input as well as the output port end in PIN diodes D3 and respectively D4. This is due to the fact that the value of the capacitor C3 is so high that it appears as a short circuit to the high frequency. Capacitors C6, C7, C8 and C9 also appear as a short circuit.

As a radio frequency signal enters the input port, it advances via the PIN diodes of the longitudinal branch to the output port. A specific control direct current passes through these diodes, while these have a specific resistance value, resulting in the attenuation of the radio-frequency signal deriving from the output port. When the control current is being altered, the resistances of the diodes of the longitudinal branch as well as the resistances of PIN diodes D3 and D4 of the transverse branches also vary. In spite of this, the impedance level in the input and output ports remains nearly constant, since, according to the invention, the quarter-wavelength transformers of the transverse branches transform the resistance represented by the PIN diode at the end of the branch. Thus, for instance, when the attenuation is increased, the resistance of the longitudinal branch of the PIN diodes increases. On the other hand, the resistance of the transverse branches decreases, because, seen from behind the quarter-wavelength transformer, from the side of the longitudinal branch, the resistance appears to decrease. The impedance of the transverse branch then varies under control, viewed from the side of the longitudinal branch, along with various attenuation values, in correspondance to the required transverse resistance value of a resistive pi ($\pi$) attenuator with a constant impedance.

FIG. 2 shows a table of values calculated by using the attenuator described above with various attenuation values. Given values are the specific impedance $Z_o2$ of the quarter-wavelength transformer, the value of the resistance $R_1(=R_2)$ supplying the constant portion of the resistance of the transverse branch, as well as the attenuation L of the attenuator. Column R presents the calculated variation of the resistance of the transverse branch according to the attenuation and column Ri' shows the input resistance of the attenuator when the output port has been terminated with a 50 Ohm resistance. The table visualizes how the resistance of the transverse branch decreases under control as the attenuation increases, i.e. the resistance of the longitudinal branch increases.

The attenuating circuit described above is merely an example of one embodiment. In practical implementation, various additional components may be needed to compensate stray quantities, and the capacitors required to direct the control direct current can possibly be disposed in some other way. The PIN diodes can also be reversed, and then the control current is reversed in the loop, so that the coil L1 needed to direct it to the ground is placed at the end on the side of the input port. The quarter-wavelength transformer construction Z1, C1, C2; Z2, C4, C5 can each be replaced with a quarter-wavelength microstrip; however, they become fairly long, and to reduce the size it is advantageous to use the construction described above, in which the use of capacitive means at the ends of the strip reduces the microstrips and increases the impedance. A reactive network accomplished with coils and capacitors is another option.

The connection described above yields a controllable attenuator which is linear in a large dynamic range. The attenuator is well suitable to be used in radio-telephone transmitters in which the transmitter chain should remain linear on all power levels. Such radio-telephones are for instance digital and analogue telephones, in which the supply voltages of the power amplifier of the transmitter are kept constant, the transmission power being then regulated with a controllable attenuator connected before the amplifying chain. When the amplifier according to the invention is being used, the rise time of the transmitter output power remains constant on various power levels by using a control current formed with an appropriate control circuit, and the control does not cause any noticeable intermodulation.

I claim:

1. A DC controllable, radio frequency (RF) attenuator having an input and an output and exhibiting substantially constant input and output impedances, respectively, over a range of RF attenuation values, said attenuator comprising:

a signal transmission path between said input and output including series connected first PIN diode means and first capacitor means;

a first transverse circuit comprising an impedance transformer and second PIN diode means connected between said input and an RF ground circuit;

a second transverse circuit comprising an impedance transformer and third PIN diode means connected between said output and said RF ground circuit, said second and third PIN diode means thereby connected so as to be identically poled and to provide a DC current flow path including said first PIN diode means; and DC control current means connected across said first capacitor means for passing a DC control current through said first, second and third PIN diode means so as to alter the RF impedances of said PIN diode means, said impedance transformers reflecting to said signal transmission path opposite sense RF impedance changes from said second and third PIN diode means to RF impedance changes seen in said first PIN diode means.

2. A controllable attentuator according to claim 1, wherein each said impedance transformer is a quarter-wavelength transmission line.

3. A controllable attenuator according to claim 2, wherein each said quarter-wavelength transmission line is a strip line including capacitive means connected between each end of said strip line and circuit ground.

4. A controllable attenuator according to claim 2, wherein each said quarter-wavelength transmission line is comprised of discrete components.

5. A controllable attenuator according to claim 1 wherein each transverse circuit includes, in series with the impedance transformer, a resistor that provides a constant portion of the impedance of the transverse circuit.

6. A controllable attenuator according to claim 1 wherein said RF ground circuit comprises a capacitor connected between a circuit ground and a common connection between opposite type electrodes of said second and third PIN diode means.

7. A controllable attenuator according to claim 1 wherein an inductive means for compensating parallel capacitance exhibited by said first PIN diode means is connected across said first PIN diode means.

8. A controllable attenuator according to claim 7 wherein said first PIN diode means comprises two PIN diodes connected in series for attenuating an RF signal provided at said input.

* * * * *